United States Patent
Hong et al.

(10) Patent No.: US 10,741,503 B2
(45) Date of Patent: Aug. 11, 2020

(54) GRAPHENE-CONTAINING MATERIALS FOR COATING AND GAP FILLING APPLICATIONS

(71) Applicant: HENKEL IP & HOLDING GMBH, Duesseldorf (DE)

(72) Inventors: Xuan Hong, Irvine, CA (US); Juliet G. Sanchez, Carson, CA (US); Xinpei Cao, Irvine, CA (US); Qizhuo Zhuo, Irvine, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 0 days.

(21) Appl. No.: 16/296,841

(22) Filed: Mar. 8, 2019

(65) Prior Publication Data

US 2019/0206805 A1    Jul. 4, 2019

Related U.S. Application Data

(63) Continuation of application No. PCT/US2017/051508, filed on Sep. 14, 2017.

(60) Provisional application No. 62/395,037, filed on Sep. 15, 2016.

(51) Int. Cl.

| | | |
|---|---|---|
| *H01L 23/552* | (2006.01) | |
| *H01B 1/22* | (2006.01) | |
| *H01B 1/24* | (2006.01) | |
| *C09D 201/00* | (2006.01) | |
| *H01Q 17/00* | (2006.01) | |
| *H01B 1/02* | (2006.01) | |
| *C22C 1/10* | (2006.01) | |
| *C22C 26/00* | (2006.01) | |
| *C08G 73/06* | (2006.01) | |

(52) U.S. Cl.
CPC ........ *H01L 23/552* (2013.01); *C08G 73/0655* (2013.01); *C09D 201/00* (2013.01); *C22C 1/101* (2013.01); *C22C 1/1005* (2013.01); *C22C 26/00* (2013.01); *H01B 1/02* (2013.01); *H01B 1/22* (2013.01); *H01B 1/24* (2013.01); *H01Q 17/00* (2013.01); *B22F 2998/10* (2013.01)

(58) Field of Classification Search
CPC ................. H05K 9/0079; H05K 1/095; H05K 2203/1131; H05K 9/0081; H05K 1/09; H05K 1/0216; H01B 1/02

USPC ............................................ 257/659; 438/106
See application file for complete search history.

(56) References Cited

U.S. PATENT DOCUMENTS

| | | | |
|---|---|---|---|
| 5,717,034 A | 2/1998 | Dershem et al. | |
| 5,718,941 A | 2/1998 | Dershem et al. | |
| 8,493,749 B2 | 7/2013 | Myers et al. | |
| 8,769,811 B2 | 7/2014 | Wurzel et al. | |
| 9,926,427 B2 * | 3/2018 | Zhamu ....................... C08K 3/04 |
| 2011/0135884 A1 * | 6/2011 | Lettow ..................... H05K 1/095 |
| | | | 428/174 |
| 2011/0256014 A1 | 10/2011 | Hong et al. | |
| 2011/0298101 A1 | 12/2011 | Pagaila et al. | |
| 2013/0045385 A1 | 2/2013 | Kim et al. | |
| 2013/0048331 A1 * | 2/2013 | Fornes ....................... C09D 5/24 |
| | | | 174/2 |
| 2016/0276056 A1 * | 9/2016 | Stolyarov .................. C08J 3/11 |
| 2016/0362565 A1 * | 12/2016 | Fornes ................... H05K 9/0083 |
| 2020/0102453 A1 * | 4/2020 | Waicukauski .......... C08L 33/08 |

FOREIGN PATENT DOCUMENTS

| | | |
|---|---|---|
| KR | 1020130104848 A | 9/2013 |
| KR | 20150101544 A | 9/2015 |
| WO | 2013137654 A1 | 9/2013 |
| WO | 2014061048 A2 | 4/2014 |
| WO | 2014178613 A1 | 11/2014 |
| WO | 2015023370 A1 | 2/2015 |
| WO | 2015034579 A1 | 3/2015 |
| WO | 2015157987 A1 | 10/2015 |

OTHER PUBLICATIONS

Rogers-Evans, M. et al., "Oxetanes as Versatile Elements in Drug Discovery and Synthesis." in Angew. Chem. Int. Ed. 2010, 49, pp. 9052-9067.

* cited by examiner

*Primary Examiner* — S. V. Clark
(74) *Attorney, Agent, or Firm* — Steven C. Bauman

(57) ABSTRACT

Provided herein are conductive formulations wherein graphene has been added into the metal system, thereby reducing curing shrinkage and improving flexibility, without significantly affecting the EMI shielding performance thereof. In accordance with certain aspects of the present invention, there are also provided methods for filling a gap in an electronic package to achieve electromagnetic interference (EMI) shielding thereof, as well as the resulting articles shielded thereby. In certain aspects of the present invention, there are also provided articles prepared using invention formulations and methods.

20 Claims, No Drawings

GRAPHENE-CONTAINING MATERIALS FOR COATING AND GAP FILLING APPLICATIONS

FIELD OF THE INVENTION

The present invention relates to electrically conductive metal particle-filled polymer systems and the use thereof, for example, as low shrinkage materials upon filling gaps in electronic packages and sintering thereof, thereby providing EMI (electromagnetic interference) shielding to the resulting electronic packages. The present invention also relates to methods of reducing the shrinkage of a formulation comprising sinterable metal particles upon sintering thereof; in another aspect, the present invention also relates to methods of reducing the brittleness of a formulation comprising sinterable metal particles upon sintering thereof; in yet another aspect, the present invention relates to methods to fill a gap in an electronic package to achieve electromagnetic interference (EMI) shielding thereof; in still another aspect, the present invention also relates to articles prepared using invention formulations and methods.

BACKGROUND OF THE INVENTION

EMI shielding is the practice of reducing the electromagnetic field in a space by blocking the field with barriers made of conductive or magnetic materials. Shielding is typically applied to enclosures to isolate electrical devices from the 'outside world'. Electromagnetic shielding that blocks radio frequency electromagnetic radiation is also known as RF shielding.

EMI shielding can reduce the coupling of radio waves, electromagnetic fields and electrostatic fields. A conductive enclosure used to block electrostatic fields is also known as a Faraday cage. The amount of reduction one can achieve depends upon such factors as the material used, its thickness, the conductivity of the coatings, the frequency of the fields of interest, and the like.

Formulations containing high levels of metal materials, after sintering, tend to have high shrinkage which could induce brittle coatings, stress issues, among other things. While adding polymer resin could help improve the brittleness of the resulting sintered material, such additions will likely compromise shielding effectivity because the polymer itself doesn't have shielding function.

While conductive paste adhesives have been used for EMI shielding protection, when the paste adhesive doesn't have high electrical conductivity, very thick films are needed in order to achieve the desired shielding performance.

These and other limitations of state of the art methods are hereby addressed by the present invention.

SUMMARY OF THE INVENTION

In accordance with the present invention, there are provided conductive formulations where graphene has been added into the metal system, thereby reducing curing shrinkage and improving flexibility, without significantly affecting the EMI shielding performance thereof.

In accordance with certain aspects of the present invention, there are also provided methods for filling a gap in an electronic package to achieve electromagnetic interference (EMI) shielding thereof, as well as the resulting articles shielded thereby.

In accordance with certain aspects of the present invention, there are also provided high conductivity films and methods for applying same.

In accordance with certain aspects of the present invention, there are also provided flexible, low shrinkage conductive coatings.

In certain aspects of the present invention, there are also provided articles prepared using invention formulations and methods.

DETAILED DESCRIPTION OF THE INVENTION

In accordance with the present invention, there are provided flexible, low shrinkage, conductive formulations comprising:
  in the range of about 75 up to about 95 wt % of sinterable, conductive metal particles,
  in the range of about 0.2 up to about 5 wt % of graphene,
  in the range of about 1 up to about 20 wt % of a diluent,
  in the range of 0 up to about 20 wt % of a polymer resin;
where:
  the sinterable, conductive metal particles are optionally surface treated and have a particle size in the range of about 1 nm up to about 50 µm,
  the graphene particles are optionally surface treated and have a particle size in the range of about 1 nm up to about 50 µm,
  the diluent is a low viscosity, reactive or non-reactive material; and
  the polymer resin is a thermoset or a thermoplastic, and where the formulation is sinterable at a temperature no greater than about 250° C.

Invention formulations can be further defined as having an electrical volume resistivity in the range of about $10^{-6}$ up to about $10^3$ ohm-cm and/or an EMI shielding effectiveness of 1-200 dB; in some embodiments, the EMI shielding effectiveness can be 1-180; in some embodiments, the EMI shielding effectiveness can be 1-160; in some embodiments, the EMI shielding effectiveness can be 1-140; in some embodiments, the EMI shielding effectiveness can be 1-120; in some embodiments, the EMI shielding effectiveness can be 1-100 dB.

EMI shielding contemplated herein can be effective over a wide range of frequencies, e.g., 10 Hz-10 GigaHertz; in some embodiments, EMI shielding can be effective over a frequency in the range of about $10^3$ Hz-200 megahertz.

The EMI effectiveness can be measured in a variety of ways, e.g., employing a waveguide system (1.7-2.8 GHz) which includes two waveguide-to-coaxial adapters and a vector network analyzer. The sample is prepared as a thin film layer with the target thickness coated on a PET film. The sample size is 5×3". The material is suitable for application with >14 KHz frequency and gives better performance at >1 GHz.

Sinterable, Conductive Metal Particles

Sinterable, conductive metal particles contemplated for use herein include gold, silver, copper, platinum, palladium, nickel, aluminum, indium, alloy of nickel (e.g., alloy 42), alloy of zinc, alloy of iron, alloy of indium, silver-plated copper, silver-plated aluminum, bismuth, tin, bismuth-tin alloy, silver-plated fiber, silver-plated graphite, silver-plated silicon carbide, silver-plated boron nitride, silver-plated diamond, silver-plated alumina, silver-plated alloy 42, silver-plated graphene, silver-coated polymer, cadmium and alloys of cadmium, lead and alloys of lead, antimony and alloys of antimony, and the like, as well as mixtures of any two or more thereof. The particulate, conductive filler typically has a particle size in the range of about 1 nm up to about 50 µm; in some embodiments, the conductive filler has a particle size in the range of about 10 nanometer up to about 20 micrometers.

In accordance with the present invention, the sinterable, conductive metal particles employed herein can be substantially nanoparticulate, or the sinterable, conductive metal particles employed herein can be substantially larger, non-nanoparticulate, or the sinterable, conductive metal particles employed herein can be a combination of nanoparticulate and non-nanoparticulate.

For example, in some embodiments of the present invention, up to 100 wt % of the sinterable, conductive metal particles employed herein have a particle size in the range of about 2-1000 nanometers, and an average particle size in the range of about 2-1000 nm, and the remaining sinterable, conductive metal particles have a particle size no greater than 50 microns.

In some embodiments of the present invention, up to 100 wt % of the sinterable, conductive metal particles employed herein have a particle size no greater than 50 microns, and an average particle size in the range of about 1-25 µm.

In some embodiments of the present invention, up to 10 wt % of the sinterable, conductive metal particles employed herein have a particle size in the range of about 2-1000 nanometers; in some embodiments, up to 20 wt % of the sinterable, conductive metal particles employed in the practice of the present invention have a particle size in the range of about 2-1000 nanometers; in some embodiments, up to 30 wt % of the sinterable, conductive metal particles employed in the practice of the present invention have a particle size in the range of about 2-1000 nanometers; in some embodiments, up to 40 wt % of the sinterable, conductive metal particles employed in the practice of the present invention have a particle size in the range of about 2-1000 nanometers; in some embodiments, up to 50 wt % of the sinterable, conductive metal particles employed in the practice of the present invention have a particle size in the range of about 2-1000 nanometers; in some embodiments, up to 60 wt % of the sinterable, conductive metal particles employed in the practice of the present invention have a particle size in the range of about 2-1000 nanometers; in some embodiments, up to 70 wt % of the sinterable, conductive metal particles employed in the practice of the present invention have a particle size in the range of about 2-1000 nanometers; in some embodiments, up to 80 wt % of the sinterable, conductive metal particles employed in the practice of the present invention have a particle size in the range of about 2-1000 nanometers; in some embodiments, up to 90 wt % of the sinterable, conductive metal particles employed in the practice of the present invention have a particle size in the range of about 2-1000 nanometers.

In some embodiments, up to 10 wt % of the sinterable, conductive metal particles employed in the practice of the present invention have a particle size in the range of about 2-500 nanometers; in some embodiments, up to 20 wt % of the sinterable, conductive metal particles employed in the practice of the present invention have a particle size in the range of about 2-500 nanometers; in some embodiments, up to 30 wt % of the sinterable, conductive metal particles employed in the practice of the present invention have a particle size in the range of about 2-500 nanometers; in some embodiments, up to 40 wt % of the sinterable, conductive metal particles employed in the practice of the present invention have a particle size in the range of about 2-500 nanometers; in some embodiments, up to 50 wt % of the sinterable, conductive metal particles employed in the practice of the present invention have a particle size in the range of about 2-500 nanometers; in some embodiments, up to 60 wt % of the sinterable, conductive metal particles employed in the practice of the present invention have a particle size in the range of about 2-500 nanometers; in some embodiments, up to 70 wt % of the sinterable, conductive metal particles employed in the practice of the present invention have a particle size in the range of about 2-500 nanometers; in some embodiments, up to 80 wt % of the sinterable, conductive metal particles employed in the practice of the present invention have a particle size in the range of about 2-500 nanometers; in some embodiments, up to 90 wt % of the sinterable, conductive metal particles employed in the practice of the present invention have a particle size in the range of about 2-500 nanometers.

In some embodiments, up to 10 wt % of the sinterable, conductive metal particles employed in the practice of the present invention have a particle size no greater than 50 microns, and an average particle size in the range of about 1-25 µm; in some embodiments, up to 20 wt % of the sinterable, conductive metal particles employed in the practice of the present invention have a particle size no greater than 50 microns, and an average particle size in the range of about 1-25 µm; in some embodiments, up to 30 wt % of the sinterable, conductive metal particles employed in the practice of the present invention have a particle size no greater than 50 microns, and an average particle size in the range of about 1-25 µm; in some embodiments, up to 40 wt % of the sinterable, conductive metal particles employed in the practice of the present invention have a particle size no greater than 50 microns, and an average particle size in the range of about 1-25 µm; in some embodiments, up to 50 wt % of the sinterable, conductive metal particles employed in the practice of the present invention have a particle size no greater than 50 microns, and an average particle size in the range of about 1-25 µm; in some embodiments, up to 60 wt % of the sinterable, conductive metal particles employed in the practice of the present invention have a particle size no greater than 50 microns, and an average particle size in the range of about 1-25 µm; in some embodiments, up to 70 wt % of the sinterable, conductive metal particles employed in the practice of the present invention have a particle size no greater than 50 microns, and an average particle size in the range of about 1-25 µm; in some embodiments, up to 80 wt % of the sinterable, conductive metal particles employed in the practice of the present invention have a particle size no greater than 50 microns, and an average particle size in the range of about 1-25 µm; in some embodiments, up to 90 wt % of the sinterable, conductive metal particles employed in the practice of the present invention have a particle size no greater than 50 microns, and an average particle size in the range of about 1-25 µm.

In some embodiments, up to 10 wt % of the sinterable, conductive metal particles filler employed in the practice of the present invention have a particle size no greater than 50 microns, and an average particle size in the range of about 10 nanometers-10 µm; in some embodiments, up to 20 wt % of the sinterable, conductive metal particles employed in the practice of the present invention have a particle size no greater than 50 microns, and an average particle size in the range of about 10 nanometers-10 µm; in some embodiments, up to 30 wt % of the sinterable, conductive metal particles employed in the practice of the present invention have a particle size no greater than 50 microns, and an average particle size in the range of about 10 nanometers-10 µm; in some embodiments, up to 40 wt % of the sinterable, conductive metal particles employed in the practice of the present invention have a particle size no greater than 50 microns, and an average particle size in the range of about 10 nanometers-10 µm; in some embodiments, up to 50 wt % of the sinterable, conductive metal particles employed in the practice of the present invention have a particle size no greater than 50 microns, and an average particle size in the range of about 10 nanometers-10 µm; in some embodiments, up to 60 wt % of the sinterable, conductive metal particles employed in the practice of the present invention have a particle size no greater than 50 microns, and an average particle size in the range of about 10 nanometers-10 µm; in some embodiments, up to 70 wt % of the sinterable, conductive metal particles employed in the practice of the present invention have a particle size no greater than 50 microns, and an average particle size in the range of about 10 nanometers-10 µm; in some embodiments, up to 80 wt % of the sinterable, conductive metal particles employed in the practice of the present invention have a particle size no greater than 50 microns, and an average particle size in the range of about 10 nanometers-10 µm; in some embodiments, up to 90 wt % of the sinterable, conductive metal particles employed in the practice of the present invention have a particle size no greater than 50 microns, and an average particle size in the range of about 10 nanometers-10 µm.

Graphene material contemplated for use herein is a single layer of carbon based material bonded in a honeycomb lattice. In some embodiments, in the range of about 0.2 up to about 5 wt % of graphene is contemplated for use herein; in some embodiments, in the range of about 0.3 up to about 4.5 wt % of graphene is contemplated for use herein; in some embodiments, in the range of about 0.4 up to about 4 wt % of graphene is contemplated for use herein; in some embodiments, in the range of about 0.5 up to about 2.5 wt % of graphene is contemplated for use herein.

Diluent

Non-Reactive Diluent

While not required for the practice of certain embodiments of the present invention, non-reactive organic diluent may optionally be employed, e.g., to facilitate handling of invention formulations as a result, for example, of lower viscosity, improved dispensability, and the like; when employed, it is preferable that the boiling point of the diluent should be close to the filler sintering temperature so that as diluent evaporates, particles touch each other and sinter.

When present, exemplary non-reactive organic diluents are selected from the group consisting of aromatic hydrocarbons (e.g., benzene, toluene, xylene, and the like), saturated hydrocarbons (e.g., hexane, cyclohexane, heptane, tetradecane), chlorinated hydrocarbons (e.g., methylene chloride, chloroform, carbon tetrachloride, dichloroethane, trichloroethylene, and the like), ethers (e.g., diethyl ether, tetrahydrofuran, dioxane, glycol ethers, monoalkyl or dialkyl ethers of ethylene glycol, and the like), polyols (e.g., polyethylene glycol, propylene glycol, polypropylene glycol, and the like), esters (e.g., ethyl acetate, butyl acetate, methoxy propyl acetate, and the like); dibasic esters (e.g., DBE-9), alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones (e.g., acetone, methyl ethyl ketone, and the like), amides (e.g., dimethylformamide, dimethylacetamide, and the like), heteroaromatic compounds (e.g., N-methylpyrrolidone, and the like), and the like, as well as mixtures of any two or more thereof.

In some embodiments, the diluent employed is butyl acetate, diethylene glycol monoethyl ether acetate (carbitol acetate), dipropylene glycol methyl ether, MEK, acetone, or DBE-9.

Reactive Diluent

Reactive organic diluents (e.g., low molecular weight organic moieties bearing one or more reactive groups thereon) may also be optionally employed, e.g., to facilitate handling of invention formulations as a result, for example, of lower viscosity, improved dispensability, and the like (and improved stability and performance properties of the resulting formulation); when employed, it is preferable that the boiling point of the reactive organic diluent should be close to the filler sintering temperature so that as reactive organic diluent evaporates and/or reacts with other components of invention formulations, particles touch each other and sinter.

Polymer Resins

A wide variety of polymer resins are contemplated for use herein; exemplary polymer resins include thermoset resins and/or thermoplastic resins.

In some embodiments, the polymer resin contemplated for use in invention formulations is a thermoset.

When invention formulations comprise a thermoset, the formulation typically comprises:
 in the range of about 0.1 wt % up to about 20 wt % of the thermoset resin, based on the total weight of the formulation,
 in the range of about 75 wt % up to about 95 wt % of the sinterable, conductive metal particles, based on the total weight of the formulation,
 in the range of about 0.2 up to about 5 wt % of graphene, and
 in the range of 1 up to about 20 wt % of the optional diluent, based on the total weight of the formulation.

In some embodiments, the resin contemplated for use in invention formulations is a thermoplastic.

When invention formulations comprise a thermoplastic, the formulation typically comprises:
 in the range of about 0.5 wt % up to about 90 wt % of the thermoplastic resin, based on the total weight of the formulation,
 in the range of about 10 wt % up to about 95 wt % of the sinterable, conductive metal particles, based on the total weight of the formulation,
 in the range of about 0.2 up to about 5 wt % of graphene, and
 in the range of 0 up to about 89.5 wt % of the optional diluent, based on the total weight of the formulation.

In some embodiments, the resin contemplated for use in invention formulations is a combination of a thermoset and a thermoplastic.

When invention formulations comprise a combination of a thermoset and a thermoplastic, the formulation typically comprises:
 in the range of about 0.1 wt % up to about 80 wt % of the thermoset resin, based on the total weight of the formulation,
 in the range of about 0.1 wt % up to about 80 wt % of the thermoplastic resin, based on the total weight of the formulation,
 in the range of about 10 wt % up to about 95 wt % of the sinterable, conductive metal particles, based on the total weight of the formulation,
 in the range of about 0.2 up to about 5 wt % of graphene, and
 in the range of 0 up to about 89.5 wt % of the optional diluent, based on the total weight of the formulation.

Exemplary thermosets contemplated for use herein include epoxies, acrylics, acrylates, acrylate esters, vinyl resins, maleimides, nadimides, itaconimides, cyanate esters, alkyd resins, cyanate esters, phenolics, benzoxazines, polyimides, functionalized polyimides, oxetanes, vinyl ethers, polyurethanes, melamines, urea-formaldehyde resins, phenol-formaldehyde resins, silicones, melamines, and the like, as well as mixtures of any two or more thereof.

Exemplary curing agents contemplated for use herein with the thermoset include ureas, aliphatic amines, aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, Lewis bases, and the like, as well as mixtures of any two or more thereof.

Epoxies

A wide variety of epoxy-functionalized resins are contemplated for use herein, e.g., liquid-type epoxy resins based on bisphenol A, solid-type epoxy resins based on bisphenol A, liquid-type epoxy resins based on bisphenol F (e.g., Epiclon EXA-835LV), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200, and the like, as well as mixtures of any two or more thereof.

In certain embodiments, the epoxy component may include the combination of two or more different bisphenol based epoxies. These bisphenol based epoxies may be selected from bisphenol A, bisphenol F, or bisphenol S epoxies, or combinations thereof. In addition, two or more different bisphenol epoxies within the same type of resin (such A, F or S) may be used.

Commercially available examples of the bisphenol epoxies contemplated for use herein include bisphenol-F-type epoxies (such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U (from Resolution) and bisphenol-A-type epoxies (such as YL-979 and 980 from Resolution).

The bisphenol epoxies available commercially from Dai Nippon and noted above are promoted as liquid undiluted epichlorohydrin-bisphenol F epoxies having much lower viscosities than conventional epoxies based on bisphenol A epoxies and have physical properties similar to liquid bisphenol A epoxies. Bisphenol F epoxy has lower viscosity than bisphenol A epoxies, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830W, and that for RE1826 as 100 ppm.

The bisphenol epoxies available commercially from Resolution and noted above are promoted as low chloride containing liquid epoxies. The bisphenol A epoxies have a EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxies have a EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxies, other epoxy compounds are contemplated for use as the epoxy component of invention formulations. For instance, cycloaliphatic epoxies, such as 3,4-epoxycyclohexylmethyl-3,4-epoxycyclohexylcarbonate, can be used. Also monofunctional, difunctional or multifunctional reactive diluents may be used to adjust the viscosity and/or lower the Tg of the resulting resin material. Exemplary reactive diluents include butyl glycidyl ether, cresyl glycidyl ether, polyethylene glycol glycidyl ether, polypropylene glycol glycidyl ether, and the like.

Epoxies suitable for use herein include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

Appropriate monofunctional epoxy coreactant diluents for optional use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters, $C_{6-28}$ alkylphenol glycidyl ethers, and the like.

In the event such a monofunctional epoxy coreactant diluent is included, such coreactant diluent should be employed in an amount from about 0.5 percent by weight to about 10 percent by weight, based on the total weight of the composition; in some embodiments, such coreactant diluent should be employed in an amount from about 0.25 percent by weight to about 5 percent by weight, based on the total weight of the composition.

The epoxy component should be present in the composition in an amount in the range of about 1 percent by weight to about 40 percent by weight; in some embodiments, invention formulations comprise about 2 percent by weight to about 18 percent by weight epoxy; in some embodiments, invention formulations comprise about 5 to about 15 percent by weight epoxy.

In some embodiments, the epoxy component employed herein is a silane modified epoxy, e.g., a composition of matter that includes:

(A) an epoxy component embraced by the following structure:

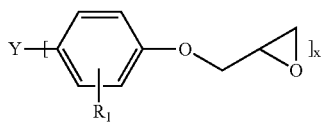

where:
Y may or may not be present and when Y present is a direct bond, $CH_2$, $CH(CH_3)_2$, $C=O$, or S,
$R_1$ here is alkyl, alkenyl, hydroxy, carboxy and halogen, and
x here is 1-4;
(B) an epoxy-functionalized alkoxy silane embraced by the following structure:

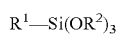

where
$R^1$ is an oxirane-containing moiety and
$R^2$ is an alkyl or alkoxy-substituted alkyl, aryl, or aralkyl group having from one to ten carbon atoms; and
(C) reaction products of components (A) and (B).

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

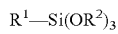

where
$R^1$ is an oxirane-containing moiety, examples of which include 2-(ethoxymethyl)oxirane, 2-(propoxymethyl)oxirane, 2-(methoxymethyl)oxirane, and 2-(3-methoxypropyl)oxirane and
$R^2$ is an alkyl or alkoxy-substituted alkyl, aryl, or aralkyl group having from one to ten carbon atoms.

In one embodiment, $R^1$ is 2-(ethoxymethyl)oxirane and $R^2$ is methyl.

Idealized structures of the aromatic epoxy used to prepare the silane modified epoxy include

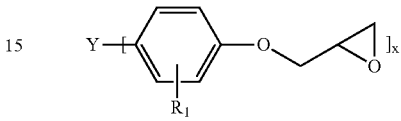

where:
Y may or may not be present, and when Y is present, it is a direct bond, $CH_2$, $CH(CH_3)_2$, $C=O$, or S,
$R_1$ is alkyl, alkenyl, hydroxy, carboxy or halogen, and
x is 1-4.

Of course, when x is 2-4, chain extended versions of the aromatic epoxy are also contemplated as being embraced by this structure.

For instance, a chain extended version of the aromatic epoxy may be embraced by the structure below

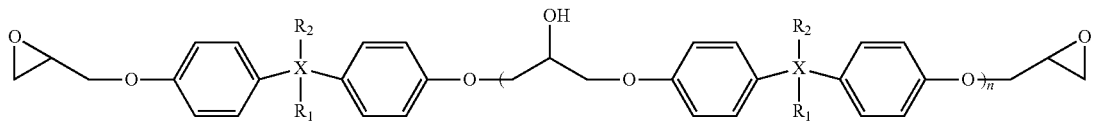

In some embodiments, the siloxane modified epoxy resin has the structure:
—(O—Si(Me)$_2$-O—Si(Me)(Z)—O—Si(Me)$_2$-O—Si(Me)$_2$)$_n$—
where:
Z is —O—(CH$_2$)$_3$—O-Ph-CH$_2$-Ph-O—(CH$_2$—CH(OH)—CH$_2$—O-Ph-CH$_2$-Ph-O—)$_n$—CH$_2$— oxirane, and
n falls in the range of about 1-4.

In some embodiments, the siloxane modified epoxy resin is produced by contacting a combination of the following components under conditions suitable to promote the reaction thereof:

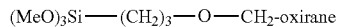

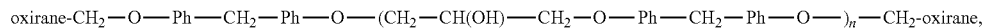

where "n" falls in the range of about 1-4.

The silane modified epoxy may also be a combination of the aromatic epoxy, the epoxy silane, and reaction products of the aromatic epoxy and the epoxy silane. The reaction products may be prepared from the aromatic epoxy and epoxy silane in a weight ratio of 1:100 to 100:1, such as a weight ratio of 1:10 to 10:1.

Quantities of epoxy monomer(s) contemplated for use in invention compositions are sufficient so that the resulting formulation comprises in the range of about 1-20 wt % of the epoxy. In certain embodiments, the resulting formulation comprises in the range of about 2-18 wt % of the epoxy. In certain embodiments, the resulting formulation comprises in the range of about 5-15 wt % of the epoxy.

Epoxy cure agents are optionally employed in combination with epoxy monomer(s). Exemplary epoxy cure agents include ureas, aliphatic and aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, Lewis bases, and the like.

When epoxy cure agents are present, invention compositions comprise in the range of about 0.1-2 wt % thereof. In certain embodiments, invention compositions comprise in the range of about 0.5-5 wt % of epoxy cure agent.

Acrylates

Acrylates contemplated for use in the practice of the present invention are well known in the art. See, for example, U.S. Pat. No. 5,717,034, the entire contents of which are hereby incorporated by reference herein.

Exemplary acrylates contemplated for use herein include monofunctional (meth)acrylates, difunctional (meth)acrylates, trifunctional (meth)acrylates, polyfunctional (meth)acrylates, and the like.

Exemplary monofunctional (meth)acrylates include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate, monopentaerythritol acrylate, dipentaerythritol acrylate, tripentaerythritol acrylate, polypentaerythritol acrylate, and the like.

Exemplary difunctional (meth)acrylates include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl)fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, and the like.

Exemplary trifunctional (meth)acrylates include trimethylolpropane trimethacrylate, trimethylolpropane triacrylate, trimethylolpropane ethoxy triacrylate, polyether triacrylate, glycerin propoxy triacrylate, and the like.

Exemplary polyfunctional (meth)acrylates include dipentaerythritol polyacrylate, dipentaerythritol hexaacrylate, pentaerythritol tetraacrylate, pentaerythritolethoxy tetraacrylate, ditrimethylolpropane tetraacrylate, and the like.

Additional exemplary acrylates contemplated for use in the practice of the present invention include those described in U.S. Pat. No. 5,717,034, the entire contents of which are hereby incorporated by reference herein.

Maleimides, Nadimides or Itaconimides

Maleimides, nadimides or itaconimides contemplated for use herein are compounds having the structure:

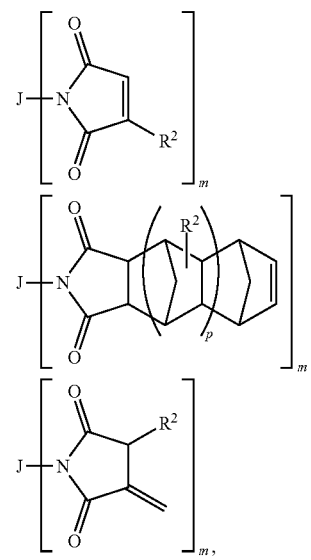

respectively, where:
  m is 1-15,
  p is 0-15,
  each $R^2$ is independently selected from hydrogen or lower alkyl (such as $C_{1-5}$), and
  J is a monovalent or a polyvalent radical comprising organic or organosiloxane radicals, and
  combinations of two or more thereof.

In some embodiments of the present invention, J is a monovalent or polyvalent radical selected from:
  hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalkynyl or alkynylaryl, provided, however, that X can be aryl only when X comprises a combination of two or more different species;
  hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene,
  heterocyclic or substituted heterocyclic species typically having in the range of about 6 up to about 500 carbon atoms,
  polysiloxane, or polysiloxane-polyurethane block copolymers, as well as combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

Exemplary compositions include those where J is oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxyarylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Cyanate Ester-Based Resins

Cyanate ester monomers contemplated for use in the practice of the present invention contain two or more ring forming cyanate (—O—C≡N) groups which cyclotrimerize to form substituted triazine rings upon heating. Because no leaving groups or volatile byproducts are formed during curing of the cyanate ester monomer, the curing reaction is referred to as addition polymerization. Suitable polycyanate ester monomers that may be used in the practice of the present invention include, for example, 1,1-bis(4-cyanatophenyl) methane, 1,1-bis(4-cyanatophenyl)ethane, 2,2-bis(4-cyanatophenyl) propane, bis(4-cyanatophenyl)-2,2-butane, 1,3-bis[2-(4-cyanato phenyl)propyl]benzene, bis(4-cyanatophenyl)ether, 4,4'-dicyanatodiphenyl, bis(4-cyanato-3,5-dimethylphenyl) methane, tris(4-cyanatophenyl)ethane, cyanated novolak, 1,3-bis[4-cyanatophenyl-1-(1-methylethylidene)]benzene, cyanated phenoldicyclopentadiene adduct, and the like. Polycyanate ester monomers utilized in accordance with the present invention may be readily prepared by reacting appropriate dihydric or polyhydric phenols with a cyanogen halide in the presence of an acid acceptor.

Monomers that can optionally be combined with polycyanate ester monomer(s) in accordance with the present invention are selected from those monomers which undergo addition polymerization. Such monomers include vinyl ethers, divinyl ethers, diallyl ethers, dimethacrylates, dipropargyl ethers, mixed propargyl allyl ethers, monomaleimides, bismaleimides, and the like. Examples of such monomers include cyclohexanedimethanol monovinyl ether, trisallylcyanurate, 1,1-bis(4-allyloxyphenyl) ethane, 1,1-bis(4-propargyloxyphenyl)ethane, 1,1-bis(4-allyloxyphenyl-4'-propargyloxyphenyl) ethane, 3-(2,2-dimethyltrimethylene acetal)-1-maleimidobenzene, 2,2,4-trimethylhexamethylene-1,6-bismaleimide, 2,2-bis[4-(4-maleimidophenoxy)phenyl]propane, and the like.

Additional cyanate esters contemplated for use in the practice of the present invention are well known in the art. See, for example, U.S. Pat. No. 5,718,941, the entire contents of which are hereby incorporated by reference herein.

Silicones

Silicones contemplated for use in the practice of the present invention are well known in the art. See, for example, U.S. Pat. No. 5,717,034, the entire contents of which are hereby incorporated by reference herein.

Oxetanes

Oxetanes (i.e., 1,3-propylene oxides) are heterocyclic organic compounds with the molecular formula $C_3H_6O$, having a four-membered ring with three carbon atoms and one oxygen atom. The term oxetane also refers generally to any organic compound containing an oxetane ring. See, for example, Burkhard et al., in Angew. Chem. Int. Ed. 2010, 49, 9052-9067, the entire contents of which are hereby incorporated by reference herein.

Polyester-Based Resins

Polyesters contemplated for use in the practice of the present invention refer to condensation polymers formed by the reaction of polyols (also known as polyhydric alcohols), with saturated or unsaturated dibasic acids. Typical polyols used are glycols such as ethylene glycol; acids commonly used are phthalic acid and maleic acid. Water, a by-product of esterification reactions, is continuously removed, driving the reaction to completion. The use of unsaturated polyesters and additives such as styrene lowers the viscosity of the resin. The initially liquid resin is converted to a solid by cross-linking chains. This is done by creating free radicals at unsaturated bonds, which propagate to other unsaturated bonds in adjacent molecules in a chain reaction, linking the adjacent chains in the process.

Polyurethane-Based Resins

Polyurethanes contemplated for use in the practice of the present invention refer to polymers composed of a chain of organic units joined by carbamate (urethane) links. Polyurethane polymers are formed by reacting an isocyanate with a polyol. Both the isocyanates and polyols used to make polyurethanes contain on average two or more functional groups per molecule.

Polyimide-Based Resins

Polyimides contemplated for use in the practice of the present invention refer to polymers composed of a chain of organic units joined by imide linkages (i.e., —C(O)—N(R)—C(O)—). Polyimide polymers can be formed by a variety of reactions, i.e., by reacting a dianhydride and a diamine, by the reaction between a dianhydride and a diisocyanate, and the like.

Melamine-Based Resins

Melamines contemplated for use in the practice of the present invention refer to hard, thermosetting plastic materials made from melamine (i.e., 1,3,5-triazine-2,4,6-triamine) and formaldehyde by polymerization. In its butylated form, it can be dissolved in n-butanol and/or xylene. It can be used to cross-link with other resins such as alkyd, epoxy, acrylic, and polyester resins.

Urea-Formaldehyde-Based Resins

Urea-formaldehydes contemplated for use in the practice of the present invention refers to a non-transparent thermosetting resin or plastic made from urea and formaldehyde heated in the presence of a mild base such as ammonia or pyridine.

Phenol-Formaldehyde-Based Resins

Phenol-formaldehydes contemplated for use in the practice of the present invention refer to synthetic polymers obtained by the reaction of phenol or substituted phenol with formaldehyde.

Exemplary thermoplastic resins contemplated for use herein include polyesters, polyacrylates (e.g., poly(methacrylate), poly(butyl methacrylate), polyurethanes, phenoxies, polyethyloxazoline, polyvinyl pyrrolidone, polyvinyl alcohol, polyacrylamide, polyglycol, and polyacrylic acid; poly(ethylene glycol), an aromatic vinyl polymer, flexible epoxy, polymer with epoxy functional groups, polycarbonate, ABS, PC/ABS alloys, nylon, inherently conductive polymer, silicone polymer, siloxane polymer, rubbers, polyolefins, vinyls polymer, polyamides, fluoropolymers, polyphenylene ethers, co-polyestercarbonates, acrylonitrile butadiene styrene copolymers, polyarylate ether sulfones or ketones, polyamide imides, polyetherimides, poly(ethylene terephthalate), poly(1,4-butylene terephthalate), polyethylenes, polypropylenes, polypropylene-EPDM blends, butadienes, styrene-butadienes, nitriles, chlorosulfonates, neoprenes, acrylonitrile butadiene styrene copolymers, polyetheresters, styrene/acrylonitrile polymer, polyphenylene sulfide, nitrile rubbers, cellulose resin, and the like, as well as mixtures of any two or more thereof.

Optional Additives

In accordance with some embodiments of the present invention, the compositions described herein may further comprise one or more flow additives, adhesion promoters, rheology modifiers, toughening agents, fluxing agents, film flexibilizers, phenol-novolac hardeners, epoxy-curing catalysts (e.g., imidazole), curing agents (e.g., dicumyl peroxide), and the like, as well as mixtures of any two or more thereof.

As used herein, the term "flow additives" refers to compounds which modify the viscosity of the formulation to which they are introduced. Exemplary compounds which impart such properties include silicon polymers, ethyl acrylate/2-ethylhexyl acrylate copolymers, alkylol ammonium salts of phosphoric acid esters of ketoxime, and the like, as well as combinations of any two or more thereof.

As used herein, the term "adhesion promoters" refers to compounds which enhance the adhesive properties of the formulation to which they are introduced.

As used herein, the term "rheology modifiers" refers to additives which modify one or more physical properties of the formulation to which they are introduced.

As used herein, the term "toughening agents" refers to additives which enhance the impact resistance of the formulation to which they are introduced.

As used herein, the term "fluxing agents" refers to reducing agents which prevent oxides from forming on the surface of the molten metal.

As used herein, the term "film flexibilizers" refers to agents which impart flexibility to the films prepared from formulations containing same.

As used herein, the term "phenol-novolac hardeners" refers to materials which participate in the further interaction of reactive groups so as to increase the cross-linking thereof—thereby enhancing the stiffness thereof.

As used herein, the term "epoxy-curing catalysts" refers to reactive agents which promote oligomerization and/or polymerization of epoxy-containing moieties, e.g., imidazole.

As used herein, the term "curing agents" refers to reactive agents such as dicumyl peroxide which promote the curing of monomeric, oligomeric or polymeric materials.

Articles/Assemblies

In accordance with another aspect of the present invention, there are provided articles/assemblies comprising a suitable substrate having one or more gaps therein, where the gap(s) are filled with an invention formulation as described herein. Suitable substrate materials include EMCs (epoxy molded compounds), laminate substrates, polyethylene terephthalates, polymethyl methacrylates, polyolefins (e.g., polyethylenes, polypropylenes, and the like), polycarbonates, epoxy resins, polyimides, polyamides, polyesters, glass, and the like.

Suitable substrate structures include dies (e.g., Si die with silicon nitride passivation, Si die with polyimide passivation, BT substrates, bare Si, and the like), stacked die, wafers, flip chip packages, hybrid memory cubes, TSV devices, SR4 substrates, SR5 substrates, and the like.

Invention formulations applied in accordance with the present invention display good adhesion to the substrate to which it is applied.

As readily recognized by those of skill in the art, adhesion between invention formulations and a substrate therefor can be determined in a variety of ways, e.g., by ASTM standard cross-cut tape test pursuant to test method D 3359-97. Typically, the adhesion between the formulation and the substrate is at least level 1B, as determined by ASTM standard cross-cut tape test pursuant to test method D 3359-97. In some embodiments, adhesion comparable to at least ASTM level 1B is observed (i.e., at least 35% of the originally adhered film surface remains attached to the substrate after being subjected to the tape test). In certain embodiments of the present invention, adhesion comparable to at least ASTM level 2B is observed (i.e., at least 65% of the originally adhered formulation remains attached to the substrate after being subjected to the tape test). In certain embodiments of the present invention, adhesion comparable to at least ASTM level 3B is observed (i.e., at least 85% of the originally adhered formulation remains attached to the substrate after being subjected to the tape test). In certain embodiments of the present invention, adhesion comparable to at least ASTM level 4B is observed (i.e., at least 95% of the originally adhered formulation remains attached to the substrate after being subjected to the tape test). In certain embodiments of the present invention, adhesion comparable to at least ASTM level 5B is observed (i.e., 100% of the originally adhered formulation remains attached to the substrate after being subjected to the tape test).

In accordance with still another aspect of the present invention, there are provided articles comprising a substrate having a substantially uniform coating of invention compositions on all exposed surfaces thereof.

In some aspects, substrate is substantially uniformly coated with an invention composition on the top and any side walls of invention articles. In some aspects, the composition is dried, cured and/or sintered after application to a suitable substrate.

In accordance with additional embodiments of the present invention, there are provided methods to fill a gap in an electronic package to achieve electromagnetic interference (EMI) shielding thereof, the methods comprising:

dispensing a conductive formulation according to any of the embodiments set forth herein at the open edge or along the gap under conditions suitable for capillary flow of the formulation, and subjecting the package to conditions suitable for capillary flow, optionally subjecting the formulation to conditions suitable to cure thermoset components thereof, and optionally removing any residual diluent therefrom.

Dispensing contemplated herein includes such methods as jetting, electrostatic spray, needle dispense, air spray, and the like.

Conditions suitable for capillary flow contemplated herein comprise subjecting the gap to reduced pressure, subjecting the gap to elevated pressure, exposing the article to a vacuum oven, exposing the article to a pressure oven, and the like.

Conditions suitable to cure thermoset components of invention formulations include oven cure, snap cure, uv cure, microwave cure, e-beam cure, and the like.

Optionally, prior to filling a gap in an electronic package according to the present invention (i.e., prior to dispensing the conductive formulation thereon), the package may optionally be subjected to surface treatment of the gap (e.g., by plasma cleaning, solvent (e.g., water) wash, corona treatment, primer treatment, and the like.

Additional further steps contemplated for optional inclusion herein include applying an encapsulant to the electronic package and/or applying a conformal coating on all or a portion of the package.

Gaps contemplated for filling employing invention formulations and methods are typically less than about 250 µm; in some embodiments, gaps contemplated for filling employing invention formulations and methods are typically less than about 200 µm; in some embodiments, gaps contemplated for filling employing invention formulations and methods are typically less than about 150 µm; in some embodiments, gaps contemplated for filling employing invention formulations and methods are typically less than about 120 µm; in some embodiments, gaps contemplated for filling employing invention formulations and methods are typically less than about 100 µm; in some embodiments, gaps contemplated for filling employing invention formulations and methods are typically less than about 80 µm; in some embodiments, gaps contemplated for filling employing invention formulations and methods are typically less than about 60 µm; in some embodiments, gaps contemplated for filling employing invention formulations and methods are typically less than about 40 µm.

In accordance with yet another embodiment of the present invention, there are provided methods for imparting electromagnetic interference shielding (EMI) protection to an electronic component, the methods comprising:

applying a composition according to the present invention to the electronic component by electrostatic spray processing, and drying, curing and/or sintering the composition.

In accordance with still another embodiment of the present invention, there are provided methods for preparing a conductive network, the method comprising:

applying a composition according to the present invention to a suitable substrate by electrostatic spray processing in a predefined pattern, and thereafter drying, curing and/or sintering the composition.

In accordance with a further embodiment of the present invention, there are provided conductive networks prepared by the above-described method.

Conductive networks contemplated herein typically have a volume resistivity of no greater than about $1\times10^{-3}$ Ohms·cm.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

Example

Comparative Formulation A, and exemplary Formulations B (containing graphene) and C (additionally containing polymer resin (e.g., high molecular weight phenolic epoxy)) are prepared by combining the designated amounts of silver filler, diluent (e.g., propylene carbonate or carbitol acetate), optionally polymer resin, and optionally, graphene, as summarized in Table 1.

TABLE 1

| Constituent | Formulation A | Formulation B | Formulation C |
| --- | --- | --- | --- |
| Ag filler | 100 | 94 | 94 |
| Propylene carbonate | — | 1 | 5 |
| Graphene | — | 5 | — |
| JER 1256* | — | — | 0.5 |
| Carbitol Acetate** | — | — | 0.94 |
| Total | 100 | 100 | 100.44 |

*is a high molecular weight phenolic epoxy.
**is a 2-(2-ethoxyethoxy)ethyl acetate; also known as diethylene glycol.

The resulting formulations are cured by subjecting to a 30 min ramp-up to 110° C., followed by a 30 min ramp-up to 200° C., and then held at 200° C. for 60 min. Results are summarized in Table 2.

TABLE 2

| Cure Profile | Formulation A | Formulation B | Formulation C |
|---|---|---|---|
| Linear cured shrinkage | 24.8 | 18.9 | 4.6 |
| Volume cured shrinkage | 57.4 | 46.8 | 13.23 |
| Electrical Conductivity (ohm-cm) | $6 \times 10^{-6}$ | $8 \times 10^{-6}$ | $6 \times 10^{-6}$ |
| Tensile modulus (Mpa) @RT | Too brittle to test | 11016 | 17059 |

Review of the results presented in Table 2 reveals that graphene-containing formulations undergo substantially less shrinkage than control formulations; and are more flexible, while retaining excellent conductivity.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A flexible, low shrinkage, conductive formulation comprising:
    in the range of about 75 up to about 95 wt % of sinterable, conductive metal particles,
    in the range of about 0.2 up to about 5 wt % of graphene,
    in the range of about 1 up to about 20 wt % of a diluent, and
    in the range of 0 up to about 20 wt % of a polymer resin; wherein:
        said sinterable, conductive metal particles are optionally surface treated and have a particle size in the range of about 1 nm up to about 50 μm,
        said graphene particles are optionally surface treated and have a particle size in the range of about 1 nm up to about 50 μm,
        said diluent is a low viscosity, reactive or non-reactive material; and
        said polymer resin is a thermoset or a thermoplastic, and wherein said formulation is sinterable at a temperature no greater than about 250° C.

2. The formulation of claim 1 wherein said sinterable metal particles are selected from the group consisting gold, silver, copper, platinum, palladium, nickel, aluminum, indium, alloy of nickel, alloy of zinc, alloy of iron, alloy of indium, silver-plated copper, silver-plated aluminum, bismuth, tin, bismuth-tin alloy, silver-plated fiber, silver-plated graphite, silver-plated silicon carbide, silver-plated boron nitride, silver-plated diamond, silver-plated alumina, silver-plated alloy 42, silver-plated graphene, silver-coated polymer, cadmium and alloys of cadmium, lead and alloys of lead, antimony and alloys of antimony, as well as a mixture of any two or more thereof.

3. The formulation of claim 1 wherein said graphene is present in the range of about 0.5 up to about 4 wt % of said formulation.

4. The formulation of claim 1 wherein said diluent is reactive.

5. The formulation of claim 4 wherein said reactive diluent is selected from an epoxy, an acrylic, an acrylate, an acrylate ester, a maleimide, a nadimide, an itaconimide, a cyanate ester, a phenolic, a benzoxazine, a polyimide, a functionalized polyimide, an oxetane, a silicone, or a melamine, as well as a mixture of any two or more thereof.

6. The formulation of claim 1 wherein said diluent is non-reactive.

7. The formulation of claim 1 wherein said diluent is an aromatic hydrocarbon, a saturated hydrocarbon, a chlorinated hydrocarbon, an ether, a polyol, an ester, a dibasic ester, an alpha-terpineol, a beta-terpineol, kerosene, a dibutylphthalate, a butyl carbitol, a butyl carbitol acetate, a carbitol acetate, an ethyl carbitol acetate, a hexylene glycol, a high boiling alcohol and esters thereof, a glycol ether, a ketone, an amide, an heteroaromatic compound, as well as a mixture of any two or more thereof.

8. The formulation of claim 1 wherein said resin is a thermoset.

9. The formulation of claim 8 wherein:
    said thermoset resin comprises in the range of about 0.1 wt % up to about 90 wt % of said formulation,
    said sinterable, conductive metal particles comprise in the range of about 10 wt % up to about 95 wt % of said formulation,
    said curing agent comprises in the range of about 0.01 wt % up to about 1 wt % of said formulation,
    said graphene comprises in the range of about 0.2 up to about 5 wt % of said formulation, and
    said optional diluent comprises in the range of 0 up to about 89.8 wt % of said formulation.

10. The formulation of claim 8 wherein said thermoset is an epoxy, an acrylic, an acrylate, an acrylate ester, a vinyl resin, a maleimide, a nadimide, an itaconimide, a cyanate ester, an alkyd resin, a cyanate ester, a phenolic, a benzoxazine, a polyimide, a functionalized polyimide, an oxetane, a vinyl ether, a polyurethane, a melamine, a urea-formaldehyde resin, a phenol-formaldehyde resin, a silicone, a melamine, as well as a mixture of any two or more thereof.

11. The formulation of claim 10 wherein the curing agent for said thermoset is a urea, an aliphatic amine, an aromatic amine, an amine hardener, a polyamide, an imidazole, a dicyandiamide, an hydrazide, an urea-amine hybrid curing system, a free radical initiator, an organic base, a transition metal catalyst, a phenol, an acid anhydride, a Lewis acid, a Lewis base, as well as a mixture of any two or more thereof.

12. The formulation of claim 1 wherein said resin is a thermoplastic.

13. The formulation of claim 12 wherein:
    said thermoplastic resin comprises in the range of about 0.5 wt % up to about 90 wt % of said formulation,
    said sinterable, conductive metal particles comprise in the range of about 10 wt % up to about 95 wt % of said formulation,
    said graphene comprises in the range of about 0.2 up to about 5 wt % of said formulation, and
    said optional diluent comprises in the range of 0 up to about 89.5 wt % of said formulation.

14. The formulation of claim 12 wherein said thermoplastic is a polyester, a polyacrylate, a polyurethane, a phenoxy, a polyethyloxyazoline, a polyvinyl pyrrolidone, a polyvinyl alcohol, a polyacrylamide, a polyglycol, a polyacrylic acid; a poly(ethylene glycol), an aromatic vinyl polymer, a flexible epoxy, a polymer with epoxy functional groups, a poly carbonate, an ABS, a PC/ABS alloy, nylon, an inherently conductive polymer, a silicone polymer, a siloxane polymer, a rubber, a polyolefin, a vinyl polymer, a polyamide, a fluoropolymer, a polyphenylene ether, a co-polyestercarbonate, an acrylonitrile butadiene styrene copolymer, a polyarylate ether sulfone or ketone, a polyamide imide, a polyetherimide, a poly(ethylene terephthalate), a poly(1,4-butylene terephthalate), a polyethylene, a polypropylene, a polypropylene-EPDM blend, a polybutadiene, a styrene-butadiene, a nitrile, a chlorosulfonate, a neoprene, an acrylonitrile butadiene styrene copolymer, a polyether-ester, a styrene/acrylonitrile polymer, a polyphenylene sulfide, a nitrile rubber, a cellulose resin, as well as a mixture of any two or more thereof.

15. An article comprising a sintered aliquot of a conductive formulation according to claim 1 applied to a suitable substrate.

16. A method to achieve electromagnetic interference (EMI) shielding of an electronic package, said method comprising:
    applying a conductive formulation according to claim 1 to said package, and
    subjecting said package to conditions suitable to sinter said formulation.

17. The method of claim 16 wherein said formulation is applied at a thickness in the range of about 0.1 up to 100 microns.

18. A shielded article comprising an electronic package wherein one or more gaps therein are filled with a sintered formulation according to claim 1.

19. A method of reducing the shrinkage of a formulation comprising sinterable metal particles upon sintering thereof at a temperature no greater than about 250° C., said method comprising introducing into said formulation, which comprises in the range of about 75 up to about 95 wt % of sinterable, conductive metal particles having a particle size in the range of about 1 nm up to about 50 μm, in the range of about 1 up to about 20 wt % of a diluent, and in the range of 0 up to about 20 wt % of a polymer resin, in the range of about 0.2 up to about 5 wt % of graphene having a particle size in the range of about 1 nm up to about 50 μm prior to the sintering thereof.

20. A method of reducing the brittleness of a formulation comprising sinterable metal particles upon sintering thereof at a temperature no greater than about 250° C., said method comprising introducing into said formulation, which comprises in the range of about 75 up to about 95 wt % of sinterable, conductive metal particles having a particle size in the range of about 1 nm up to about 50 μm, in the range of about 1 up to about 20 wt % of a diluent, and in the range of 0 up to about 20 wt % of a polymer resin, in the range of about 0.2 up to about 5 wt % of graphene having a particle size in the range of about 1 nm up to about 50 μm prior to the sintering thereof.

* * * * *

UNITED STATES PATENT AND TRADEMARK OFFICE
CERTIFICATE OF CORRECTION

PATENT NO. : 10,741,503 B2
APPLICATION NO. : 16/296841
DATED : August 11, 2020
INVENTOR(S) : Xuan Hong et al.

It is certified that error appears in the above-identified patent and that said Letters Patent is hereby corrected as shown below:

In the Specification

Column 7, Line 33: Change "Epiclon HP-7200" to --Epiclon HP-7200L--.

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*